Figure 1:
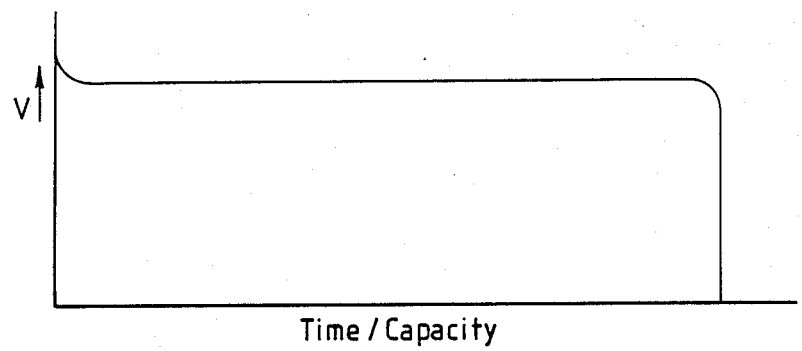

United States Patent [19]

Faulkner

[11] Patent Number: 4,912,392
[45] Date of Patent: Mar. 27, 1990

[54] BATTERY CHARGE STATE MONITOR

[75] Inventor: Andrew Faulkner, Warks, England

[73] Assignee: Husky Computer Limited, Coventry, England

[21] Appl. No.: 109,626

[22] Filed: Oct. 16, 1987

[30] Foreign Application Priority Data

Oct. 18, 1986 [GB] United Kingdom ............ 8625035

[51] Int. Cl.⁴ .............................................. H02J 7/04
[52] U.S. Cl. ........................................ 320/44; 320/32
[58] Field of Search ............... 320/32, 44, 45, 48

[56] References Cited

U.S. PATENT DOCUMENTS

| | | | |
|---|---|---|---|
| 3,484,681 | 12/1969 | Grady, Jr. ...................... | 320/44 X |
| 3,735,234 | 5/1973 | Godard ............................ | 320/44 |
| 3,895,284 | 7/1975 | Schweizer et al. ............. | 320/44 X |
| 4,247,812 | 1/1981 | Patry et al. .................... | 320/44 |
| 4,288,734 | 9/1981 | Finger ............................ | 320/44 X |
| 4,307,330 | 12/1981 | Bielot ............................. | 320/44 |

Primary Examiner—R. J. Hickey
Attorney, Agent, or Firm—Charles E. Brown; Charles A. Brown

[57] ABSTRACT

A battery charge state monitor has a charging circuit (40) for charging nickel cadmium cells. An integrating (80) generates a saw-tooth waveform during charging and discharging of the cells, the frequency of which is proportional to the rate of charging and discharging of the cells. The saw-tooth waveform is converted into a train of pulses by a pulse shaping circuit (120), the pulses being counted by a counter (140). During initial calibration, the number of pulses generated for an exact known quantity of charge is stored in a microprocessor (160). During subsequent use and charging of the cells, the counter (140) counts in one direction during charging and in the opposite direction during discharge. Since the frequency of pulses generated during charging and discharging is exactly proportional to the rate of charging and discharging the count of the counter (140) provides an exact indication of the state of charge of the cells.

11 Claims, 1 Drawing Sheet

BATTERY CHARGE STATE MONITOR

The present invention relates to apparatus for monitoring the state of charge of a battery.

Portable electronic equipment such as portable computers are powered by batteries such as rechargeable nickel-cadmium (NiCd) batteries. However, a major problem with such equipment is ensuring that there is sufficient charge in the battery to enable the equipment to complete a particular function before recharging becomes necessary. With a portable computer unexpected loss of power can prevent a job being completed when the task is reliant on the computer. In extreme circumstances data loss is possible.

Hitherto, attempts have been made to provide a reliable indication of the amount of charge remaining in a battery power supply for such equipment but these have generally been confined to monitoring the voltage output of the batteries. Since the voltage output of nickel-cadium batteries remains substantially constant from full discharge to almost complete discharge it has proved impossible to provide an accurate indicator of the state of battery charge based on the battery voltage.

The present invention seeks to provide an improved apparatus for monitoring the state of a charge of a battery.

Accordingly, the present invention provides an apparatus for monitoring the state of charge of a battery comprising means for monitoring the rate of charge or discharge of the battery and generating a series of pulses during said charging or discharging, the frequency of said pulses being proportional to the rate of charging or discharge; means for counting said pulses and providing an indication of the state of charge of said battery in dependence on said count.

The present invention also provides a battery powered computer comprising means for monitoring the rate of charge or discharge of a nickel-cadmium battery of the computer and generating a series of pulses during said charging or discharging, the frequency of said pulses being proportional to the rate of charging or discharge; means for counting said pulses and providing an indication of the state of charge of said battery in dependence on said count.

Figure 2:
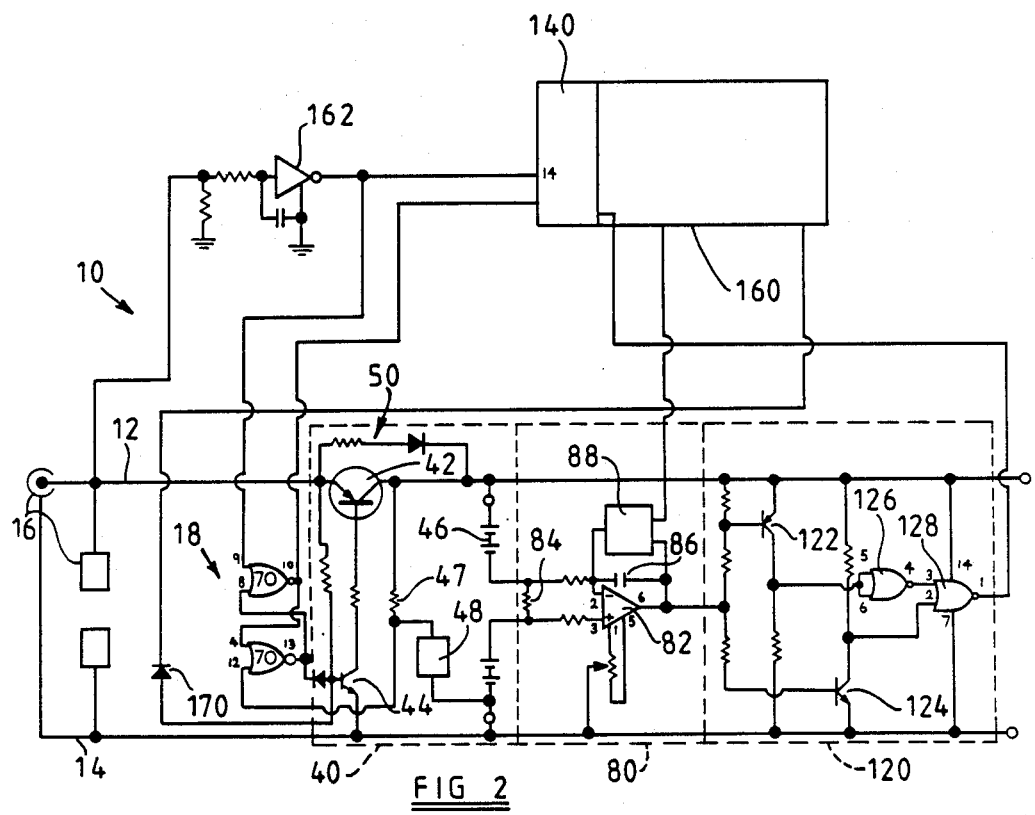

The present invention is further described hereinafter, by way of example, with reference to the accompanying drawings, in which:

FIG. 1 is a graph of voltage against time/charge capacity of a nickel-cadmium battery; and FIG. 2 is a circuit diagram of a preferred embodiment of the present invention in a portable computer.

Referring to the drawings, FIG. 1 shows that the variation of the output voltage of a NiCd battery remains substantially constant as the battery charge state varies from fully charged to almost fully discharged. Therefore, monitoring the output voltage of the battery clearly would not provide a reliable indication of the state of charge of the battery.

FIG. 2 shows a preferred circuit 10 for monitoring the state of charge of nickel-cadmium batteries in a portable computer, comprising a charging circuit 40 an integrating circuit 80, a pulse shaping circuit 120, and a counter 140 forming part of a microprocessor 160.

The circuit 10 has positive and negative voltage rails 12, 14 having input terminals 16 connectable to a source of charging current.

The charging circuit 40 has a charging power transistor 42 whose collected emitter path is connected in the supply rail 12 and whose base is coupled through a switching transistor 44 to the negative supply rail 14.

The base of the switching transistor 44 is connected to one output of a bi-stable flip flop 18 whose other output is connected to an input of the counter 140. The charging circuit also includes a series of nickel-cadmium batteries 46 connected in series across the supply rails 12, 14 and to which charging current is supplied through the transistor 42. A temperature sensor 48 conveniently in the form of a bimetal strip is closely associated with the batteries 46 and interconnects the supply rails 12 and 14 via a series resistance 47 to provide a switching pulse to one input of the bi-stable flip flop 18 (connected to the junction of the sensor 48 and resistance 47) when the bimetal strip 48 is tripped. The latter serves to monitor the temperature of the batteries 46 and makes use of the fact that when the nickel-cadmium batteries are fully charged their temperature rises rapidly, thus tripping the bimetal strip 48 to switch the flip flop 18. A second input of the bi-stable flip flop 18 is connected to an output of an operational amplifier 162 which is also connected to an input 14 of the counter. The input of amplifier 162 is connected to the positive voltage rail 12 so that amplifier 162 applies a logic 1 signal to counter input 14 and the flip flop second input when a charging source is connected to the terminals 16.

The integrating circuit 80 has an operational amplifier 82 whose inverting and non-inverting inputs are connected across a very low value resistance 84, typically 0.2 ohms, which is connected in series with the batteries 46. Preferably, the resistance 84 is connected at the midpoint of the series array of batteries, although this is not critical.

The output of the operational simplifier 82 is connected to its inverting input by way of a low leakage capacitance 86 and a parallel switch 88 controlled by the microprocessor 160 of the computer. As charging or discharging current flows through the resistance 84 the capacitance 86 is charged, causing the output of the operational amplifier to increase linearly until at a preset output voltage level monitored by the microprocessor the switch 88 is tripped by the microprocessor 160 discharging the capacitance 86 and causing the output voltage of the operational amplifier 82 to decrease in a linear manner. When the output voltage level falls to a second pre-set value, the switch 88 is again tripped by the microprocessor 160 to discharge the capacitance 86 rapidly and fully. This then allows the capacitance 86 once again to begin charging, causing the output voltage level of the amplifier 82 once again to rise. This cycle is repeated during both charging and discharging of the batteries 46, the output of the integrating circuit 80, therefore, being a sawtooth wave form.

As will be appreciated, the greater the current flowing through the batteries 46 and therefore the resistance 84, the faster capacitance 86 charges and therefore the greater the frequency of the output wave form of the integrating circuit 80.

The output of the integrating circuit 80 is applied to a pulse shaping circuit 120 comprising a pair of transistors 122, 124 whose outputs are coupled through a pair of gating circuits 126, 128 to an input of the microprocessor and a further input of the counting circuit 140. The output of the pulse shaping circuit 120 changes state (i.e. switches from logic 1 to logic 0 or vice versa)

each time the output of the integrating circuit goes high or low. Since the frequency of the output wave form of the integrating circuit 80 is proportional to the current flowing through the batteries 46, the pulse shaping circuit 120 produces a train of pulses whose frequency, and therefore whose number, is proportional to the charging or discharging current flowing through the batteries. These pulses are counted by the counter 140 which counts in one direction if the batteries are charging and in the reverse direction of they are discharging. This therefore provides a count representative of the total amount of charging current or discharge current which has flowed through the batteries 46, and from this a clear assessment of the state of charge of the batteries can be made.

The operation of the circuit is described below. Before the circuit can be used to provide an accurate assessment of the state of charge of the batteries it must be calibrated and this is effected at the manufacturing stage. A precise amount of charging current is passed through the batteries 46 for a preset time period. The number of pulses produced by the pulse shaping circuit 120 during this time is counted by the counter and stored for use by the micro processor as a calibration factor. Having determined the number of pulses which are generated by a clearly known quantity of charging current (and therefore discharging current) the state of charge or discharge of the batteries can accurately be assessed as a function of the pulse count during their charging or discharge.

In order to charge the batteries 46 a charger is connected to the charging terminals 16. This produces a logic 1 signal at the output of amplifier 162 which trips the flip flop 18, turning transistor 44 ON which in turn turns the charging transistor 42 ON. The application of the logic 1 signal to input 14 of the counter also causes this to count in a first or charging direction. When charging is fully completed the temperature of the batteries 46 rises rapidly, tripping the sensor 48 which in turn trips the flip flop 18. The charging transistor 42 is therefore turned off by one output of the flip flop and a signal applied by the other output of the flip flop 18 to the counter 140, this signal being used to set the counter to indicate that the batteries are fully charged. If the charger is then removed, the output of amplifier 162 drops to logic 0, which is applied to input 14 of the counter to reverse the direction of count.

During use of the equipment, as the batteries 46 discharge the counter 140 counts the pulses generated by the integrating circuit 80 and the pulse shaping circuit 120 in a second or discharging direction. This count is directly proportional to the amount of charge lost by the batteries 46 and a comparison with the calibration count previously stored in the microprocessor therefore enables an accurate indication of the amount of charge remaining in the batteries to be made by the processor. This can be indicated on a visual display such as a liquid crystal display, for example as a percentage figure.

As is mentioned above, the presence of a charging source at the charging terminals 16 produces a logic 1 signal at the output of amplifier 162 to set the counter counting in a charging direction and to set the flip flop in turn transistors 44 and 42 ON. However, if the charging source is removed before the batteries are fully charged and therefore before transistors 44 and 42 are turned off by the sensor 48, the output of amplifier 162 and therefore the signal at pin 14 remains at logic 1. As a result of reverse conduction through the collector-emitter path of the charging transistor 42, the voltage across the batteries 46 appears at input 14 giving a false indication that the charging source is still present and causing the counter to continue counting in a charging direction.

Therefore, in order to test for the presence of the charging source a negative-going pulse is applied from the microprocessor 160 to the base of the switching transistor 44 every five seconds via diode 170. This pulse turns off the charging transistor 42, isolating the batteries 46 from the input of amplifier 162, as a result of which if the charging source is not present then the input and therefore the output of amplifier 162 will switch from logic 1 to logic 0, setting the counter to count in the discharging direction and resetting the flip flop to hold transistors 44 and 42 OFF. A clear indication is therefore provided of the absence of the charging source 16 ensuring that the counter counts in the discharge direction and enabling the charging transistor 42 to be turned off. The latter also prevents unnecessary discharge of the batteries 46 through the transistor 42. When the charging source is reconnected to the terminal 16, the signal at the output of amplifier 162 again becomes logic 1 indicating that the charging source 16 is present and allowing the transistor 42 to be turned on for charging.

A series circuit 50 comprising a resistance and diode are connected in parallel with the collector-emitter path of the charging transistor 42. This circuit ensures that, once the batteries 46 are fully charged, while the charging source is still connected and the transistor 42 is turned off a trickle charge is maintained to the batteries. The level of this trickle charge is sufficient to ensure that there is a net charging current applied to the batteries to ensure that they are maintained fully charged even while the computer is being used.

It will be obvious from the above that the circuit clearly distinguishes between pulses generated during charging and pulses generated during discharge of the batteries 46, the counter counting is a first direction during charge and a reverse direction during discharge. Calculation of the state of charge of the batteries 46 from the pulse count during charging and discharge can accurately be assessed and is conveniently effected by a suitable programme stored in the microprocessor.

I claim:

1. An apparatus for monitoring the state of charge of a battery comprising first means for monitoring the rate of charge or discharge of the battery and generating a series of pulses during said charging or discharging, the frequency of said pulses being proportional to the rate of charging or discharging; second means for counting said pulses and providing an indication of the state of charge of said battery in dependence on said count, a charging circuit for applying charging current from a charging source to said battery; and means for monitoring the state of charge of said battery and for inhibiting said charging circuit when said battery becomes fully charged to inhibit further charging of said battery, and for resetting said second means to indicate a state of full charge of said battery.

2. Apparatus as claimed in claim 1 wherein said first means comprises a capacitance and third means for enabling alternately charging of said capacitance at a rate proportional to the rate of charging or discharging of said battery and discharging of said capacitance.

3. Apparatus as claimed in claim 2 wherein said third means is operable responsively to charge on said capacitance rising to a first preset level to cause said capacitance to begin discharging and is operable responsively to said charge dropping to a second preset level to cause said capacitance to discharge fully and enable recharging to commence.

4. Apparatus as claimed in claim 2 wherein said first means is operable to monitor the rate of charge or discharge of the battery by monitoring current flow through said battery and charge said capacitance in dependence on said flow.

5. Apparatus as claimed in claim 2 wherein said first means comprises a pulse shaping circuit operable to monitor the charging and discharging of said capacitance and generate said series of pulses whose frequency is proportional to the charging and discharging cycle time of said capacitance.

6. Apparatus as claimed in claim 1 further comprising fourth means for sensing the presence or absence of a charging source and controlling the direction of count of said second means in dependence thereon.

7. Apparatus as claimed in claim 6 wherein said fourth means is operable to inhibit said charging circuit in the absence of said charging source to prevent discharge of said battery through said charging circuit.

8. Apparatus as claimed in claim 6 wherein said fourth means comprises means for generating a first signal in response to the presence of said charging source; means for enabling said charging circuit in response to said first signal; and means for periodically testing for the presence of said charging source by inhibiting said charging circuit for a preset period of time, whereby to cause said generating means to generate a second signal in the absence of said charging source and to cause said enabling means to inhibit said charging circuit in response to said second signal.

9. Apparatus as claimed in claim 7 wherein said fourth means comprises means for generating a first signal in response to the presence of said charging source; means for enabling said charging circuit in response to said first signal; and means for periodically testing for the presence of said charging source by inhibiting said charging circuit for a preset period of time, whereby to cause said generating means to generate a second signal in the absence of said charging source and to cause said enabling means to inhibit said charging circuit in response to said second signal.

10. Apparatus as claimed in claim 8 further comprising means for monitoring the state of charge of said battery charging and for inhibiting said charging circuit when said battery becomes fully charged to inhibit further charging of said battery, and for resetting said second means to indicate a state of full charge of said battery.

11. Apparatus as claimed in claim 6 wherein said fourth means is a microprocessor.

* * * * *